(12) United States Patent
Cheng et al.

(10) Patent No.: US 12,446,244 B2
(45) Date of Patent: Oct. 14, 2025

(54) SEMICONDUCTOR STRUCTURE AND MANUFACTURING METHOD THEREOF

(71) Applicant: ENKRIS SEMICONDUCTOR, INC., Jiangsu (CN)

(72) Inventors: Kai Cheng, Jiangsu (CN); Peng Xiang, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 456 days.

(21) Appl. No.: 18/010,915

(22) PCT Filed: Nov. 6, 2020

(86) PCT No.: PCT/CN2020/127246
§ 371 (c)(1),
(2) Date: Dec. 16, 2022

(87) PCT Pub. No.: WO2022/094966
PCT Pub. Date: May 12, 2022

(65) Prior Publication Data
US 2023/0238446 A1    Jul. 27, 2023

(51) Int. Cl.
*H10D 30/01* (2025.01)
*H10D 30/47* (2025.01)
(Continued)

(52) U.S. Cl.
CPC ......... *H10D 30/015* (2025.01); *H10D 30/475* (2025.01); *H10D 62/115* (2025.01); *H10D 62/8503* (2025.01)

(58) Field of Classification Search
None
See application file for complete search history.

(56) References Cited

U.S. PATENT DOCUMENTS

| 6,498,069 B1 | 12/2002 | Grivna |
| 8,536,623 B2 | 9/2013 | Kim et al. |

(Continued)

FOREIGN PATENT DOCUMENTS

| CN | 102769033 A | 11/2012 |
| CN | 103035705 A | 4/2013 |

(Continued)

OTHER PUBLICATIONS

ISA State Intellectual Property Office of the People's Republic of China, International Search Report Issued in Application No. PCT/CN2020/127246, Jul. 21, 2021, WIPO, 4 pages.

(Continued)

*Primary Examiner* — Khaja Ahmad
(74) *Attorney, Agent, or Firm* — The Small Patent Law Group LLC; Christopher R. Carroll

(57) ABSTRACT

A semiconductor structure and a manufacturing method thereof are provided in the present disclosure. The semiconductor structure includes a semiconductor substrate; a plurality of stacked structures and a plurality of isolation structures on the semiconductor substrate, wherein the stacked structures are spaced apart each other, and each of the isolation structures are located between adjacent stacked structures; each of the stacked structures comprises a nucleation layer and a first epitaxial layer from bottom to top; and a heterojunction structure on the plurality of stacked structures, wherein the heterojunction structure is distributed over an entire surface, and an air gap is formed between the heterojunction structure and each of the isolation structures.

14 Claims, 4 Drawing Sheets

(51) Int. Cl.
  *H10D 62/10*    (2025.01)
  *H10D 62/85*    (2025.01)

(56) References Cited

U.S. PATENT DOCUMENTS

| | | | |
|---|---|---|---|
| 8,741,706 B2 | 6/2014 | Kim et al. | |
| 2013/0082240 A1 | 4/2013 | Kim et al. | |
| 2013/0302953 A1 | 11/2013 | Kim et al. | |
| 2018/0175184 A1 | 6/2018 | Then et al. | |
| 2019/0051538 A1* | 2/2019 | Fujioka | H01L 23/3732 |
| 2019/0148533 A1* | 5/2019 | Radosavljevic | H10D 30/475 257/76 |
| 2019/0157181 A1* | 5/2019 | Hobart | H10D 64/511 |

FOREIGN PATENT DOCUMENTS

| | | |
|---|---|---|
| CN | 103117294 A | 5/2013 |
| CN | 103247517 A | 8/2013 |
| CN | 106328519 A | 1/2017 |
| CN | 107660313 A | 2/2018 |
| CN | 110379854 A | 10/2019 |
| CN | 111508839 A | 8/2020 |
| JP | 2008235740 A | 10/2008 |
| TW | 201944594 A | 11/2019 |

OTHER PUBLICATIONS

TW Patent Office, Office Action Issued in Application No. 110141393, Oct. 5, 2022, 19 pages. (Submitted with Machine/Partial Translation).

ISA State Intellectual Property Office of the People's Republic of China, Written Opinion of the International Searching Authority Issued in Application No. PCT/CN2020/127246, Jul. 21, 2021, WIPO, 6 pages. (Submitted with Machine/ Partial Translation).

State Intellectual Property Office of the People's Republic of China, Office Action and Search Report Issued in Application No. 2020801062850, Jun. 24, 2025, 14 pages. (Submitted with English Translation).

* cited by examiner

Provide a semiconductor substrate, form stacked structures and isolation structures on the semiconductor substrate respectively, where the stacked structures are spaced apart each other, and each of the isolation structures is located between adjacent stacked structures; each of the stacked structures includes a nucleation layer, a buffer layer, and a first epitaxial layer from bottom to top — S1

Epitaxially growing a heterojunction structure on the stacked structure, where heterojunction structures on adjacent stacked structures are coalesced and distributed over an entire surface, and an air gap is formed between the heterojunction structure and each isolation structure — S2

FIG.1

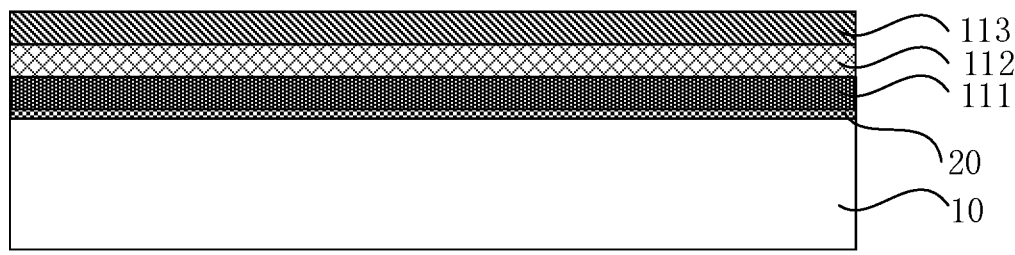

FIG.2

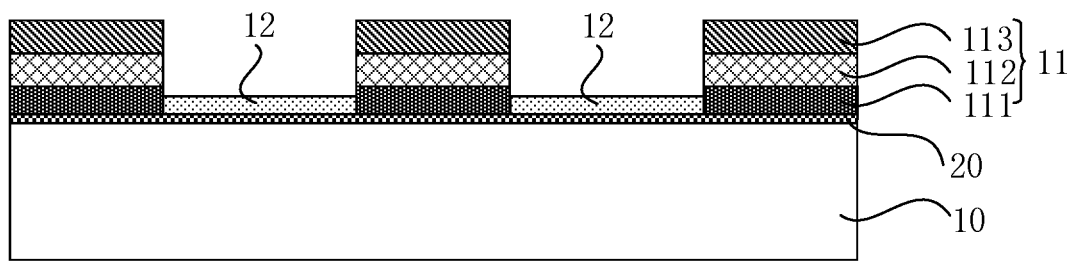

FIG.3

SEMICONDUCTOR STRUCTURE AND MANUFACTURING METHOD THEREOF

CROSS-REFERENCE TO RELATED APPLICATIONS

This application is a national phase entry of and claims priority to International Patent Application No. PCT/CN2020/127246 (filed 6 Nov. 2020), the entire disclosure of which is incorporated herein by reference.

TECHNICAL FIELD

This present disclosure relates to the technology field of semiconductor, and more particular, to a method of manufacturing semiconductor structure.

BACKGROUND

Wide-bandgap semiconductor material such as Group III-nitride, as a typical representative of the third-generation semiconductor materials, has excellent characteristics of large bandgap, high pressure resistance, high temperature resistance, high electron saturation velocity and drift velocity, and easy formation of high-quality heterostructure, and thus are very suitable for manufacturing of electronic devices with high temperature, high frequency and large power.

For example, AlGaN/GaN heterojunctions are widely applied to semi-conductor structures such as High Electron Mobility Transistors (HEMT) due to high-concentration two-dimensional electron gas (2DEG) existing at an AlGaN/GaN interface caused by relatively strong spontaneous polarization and piezoelectric polarization.

Because of the diffusion at the interface of the semiconductor substrate (such as a silicon substrate) between the GaN epitaxy, the resistance at the substrate interface is low, therefore the interface is a conductive layer. The conductive layer causes device leakage, and the substrate conductive layer also causes radio frequency (RF) loss for RF devices, thereby reducing device performance. In view of this, it is necessary to provide a new semiconductor structure and a manufacturing method thereof so as to solve the above technical problems.

SUMMARY

The purpose of the present disclosure is to provide a semiconductor structure and a manufacturing method thereof.

To achieve the above-mentioned purpose, a first aspect of the present disclosure provides a semiconductor structure, including:
 a semiconductor substrate;
 a plurality of stacked structures and a plurality of isolation structures on the semiconductor substrate, where the stacked structures are spaced apart each other, and each of the isolation structures is located between adjacent stacked structures; each of the stacked structures includes a nucleation layer and a first epitaxial layer from bottom to top; and
 a heterojunction structure on the plurality of stacked structures, where the heterojunction structure is distributed over an entire surface, and an air gap is formed between the heterojunction structure and each of the isolation structures.

In some examples, each of the stacked structures further includes a buffer layer between the nucleation layer and the first epitaxial layer.

In some examples, the heterojunction structure includes a channel layer and a barrier layer from bottom to top, the first epitaxial layer and the channel layer are made of a same material; or
 the heterojunction structure includes a back-barrier layer and a channel layer from bottom to top, the first epitaxial layer and the back-barrier layer are made of a same material.

In some examples, a material of the semiconductor substrate is sapphire, silicon carbide, silicon or diamond, and a material of the isolation structures is at least one of silicon oxide, silicon nitride, aluminum oxide, hafnium oxide, magnesium oxide, titanium oxide, or gallium oxide.

In some examples, a material of the nucleation layer is AlN or AlGaN, and a material of the first epitaxial layer and the heterojunction structure are at least one of GaN, AlN, InN, AlGaN, InGaN, AlInN or AlInGaN.

In some examples, the heterojunction structure includes: a source region, a drain region, and a gate region between the source region and the drain region; where a source electrode is on the source region, a drain electrode is on the drain region, and a P-type semiconductor layer is in the gate region and a gate electrode is on the P-type semiconductor layer.

Another aspect of the present disclosure provides a method of manufacturing a semiconductor structure, including:
 providing a semiconductor substrate, forming a plurality of stacked structures and a plurality of isolation structures on the semiconductor substrate respectively, where the stacked structures are spaced apart each other, and each of the isolation structures is located between adjacent stacked structures; each of the stacked structures comprises a nucleation layer and a first epitaxial layer from bottom to top;
 epitaxially growing a heterojunction structure on each of the plurality of stacked structures, where heterojunction structures on adjacent stacked structures are coalesced distributed over an entire surface, and an air gap is formed between the heterojunction structure and each of the isolation structures.

In some examples, forming a plurality of stacked structures and a plurality of isolation structures on the semiconductor substrate respectively includes:
 forming the isolation structures spaced apart on the semiconductor substrate, and growing a nucleation layer and a first epitaxial layer in sequence on the semiconductor substrate by using the isolation structures as masks to form the plurality of stacked structures.

In some examples, forming a plurality of stacked structures and a plurality of isolation structures on the semiconductor substrate respectively includes:
 growing a nucleation layer and a first epitaxial layer in sequence on the semiconductor substrate;
 removing parts of the nucleation layer and parts of the first epitaxial layer to expose the semiconductor substrate, such that rests of nucleation layer and rests of the first epitaxial layer spacing apart to form the plurality of stacked structures;
 forming an isolation structure on the exposed semiconductor substrate.

In some examples, a buffer layer is further grown on the nucleation layer before the first epitaxial layer is grown.

In some examples, a material of the semiconductor substrate is sapphire, silicon carbide, silicon or diamond, and a material of the isolation structures is at least one of silicon oxide, silicon nitride, aluminum oxide, hafnium oxide, magnesium oxide, titanium oxide, or gallium oxide, a formation method of the plurality of isolation structures includes:

forming an insulating material layer by physical vapor deposition or chemical vapor deposition;

patterning the insulating material layer to form the plurality of isolation structures;

or the method formation method of the plurality of isolation structures includes:

forming a plurality of trenches in the semiconductor substrate, and filling an insulating material layer in the trenches to form the plurality of isolation structures.

In some examples, a material of the semiconductor substrate is silicon, a material of the isolation structures is silicon dioxide, and the isolation structures are formed by local thermal oxidation.

In some examples, the heterojunction structure includes a channel layer and a barrier layer from bottom to top, the first epitaxial layer and the channel layer are made of a same material;

or the heterojunction structure comprises a back-barrier layer and a channel layer from bottom to top, the first epitaxial layer and the back-barrier layer are made of a same material.

In some examples, the heterojunction structure includes: a source region and a drain region, and a gate region between the source region and the drain region; the method further including:

forming a source electrode on the source region, forming a drain electrode on the drain region, and forming a P-type semiconductor layer in the gate region and forming a gate electrode on the P-type semiconductor layer.

BRIEF DESCRIPTION OF THE DRAWINGS

FIG. 1 is a flowchart of a method of manufacturing semiconductor structure according to a first embodiment of the present disclosure.

FIG. 2 and FIG. 3 are schematic views illustrating intermediate structures corresponding to the process of FIG. 1.

Figure 4:
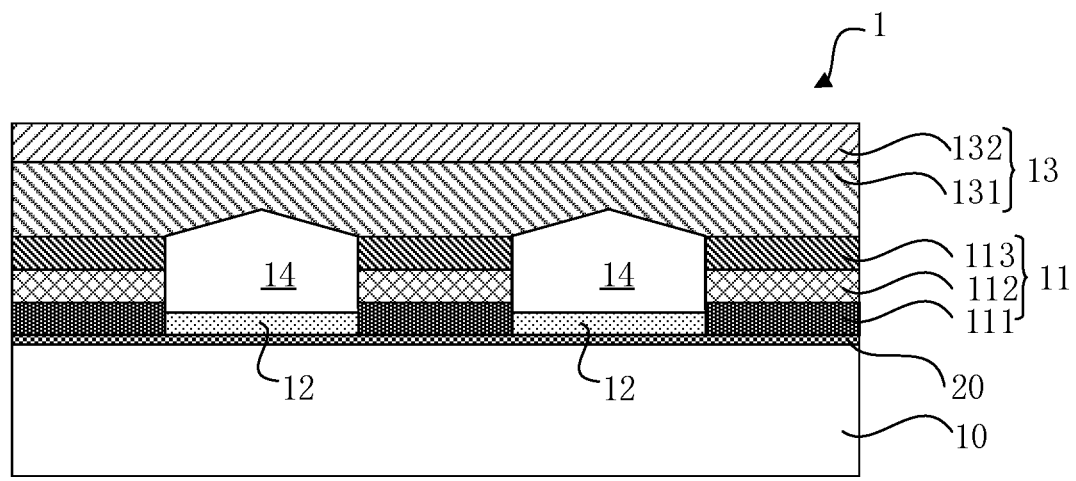
FIG. 4 is a schematic view of a cross-sectional structure of a semiconductor structure according to a first embodiment of the present disclosure.

To facilitate the understanding of the present disclosure, all reference signs present in the present disclosure are listed below:

| | |
|---|---|
| semiconductor substrate 10 | stacked structure 11 |
| isolation structure 12 | nucleation layer 111 |
| buffer layer 112 | first epitaxial layer 113 |
| heterojunction structure 13 | air gap 14 |
| channel layer 131 | barrier layer 132 |
| back-barrier layer 133 | substrate conductive layer 20 |
| source region 13a | drain region 13b |
| gate region 13c | source electrode 15a |
| drain electrode 16b | gate electrode 15c |
| P-type semiconductor layer 16 | |
| semiconductor structures 1, 2, 3, 4, 5, 6 | |

DETAILED DESCRIPTION OF THE EMBODIMENTS

In order to make the above-mentioned objects, features and advantages of the present disclosure more obvious and understandable, embodiments of the present disclosure will be described in detail below with reference to the accompanying drawings.

FIG. 1 is a flowchart of a method of manufacturing semiconductor structure according to a first embodiment of the present disclosure. FIG. 2 and FIG. 3 are schematic views illustrating intermediate structures corresponding to the process of FIG. 1. FIG. 4 is a schematic view of a cross-sectional structure of a semiconductor structure according to a first embodiment of the present disclosure.

First, referring to step S1 in FIG. 1 and as shown in FIG. 2 and FIG. 3, a semiconductor substrate is provided, a plurality of stacked structures 11 and a plurality of isolation structures 12 on the semiconductor substrate 10 are formed respectively, where the stacked structures 11 are spaced apart, and each of the isolation structures 12 is located between adjacent stacked structures 11; and each of the stacked structures 11 includes a nucleation layer 11, a buffer layer 112 and a first epitaxial layer 113 from bottom to top.

In the embodiment, the stacked structures 11 and the isolation structures 12 are formed on the semiconductor substrate 10 respectively by the following steps.

Step S11: referring to FIG. 2, a nucleation layer 111, a buffer layer 112 and a first epitaxial layer 113 are sequentially grown on the semiconductor substrate 10.

Step S12: referring to FIG. 3, parts of the nucleation layer 111, parts of the buffer layer 112 and parts of the first epitaxial layer 113 are removed to expose the semiconductor substrate 10, and rests of nucleation layer 111, buffer layer, and first epitaxial layer 113 space apart to form the plurality of stacked structures 11.

Step S13: continuing with FIG. 3, the isolation structures 12 are formed on the exposed part of semiconductor substrate 10.

In step S11, the material of the semiconductor substrate 10 can include sapphire, silicon carbide, silicon or diamond.

The material of the nucleation layer 111 is a Group III nitride-based material, such as AlGaN, or the like. The material of the buffer layer 112 is also a Group III nitride-based material, such as at least one of GaN, AlN, InN, AlGaN, InGaN, AlInN, or AlInGaN. The nucleation layer 111 can relieve issues of lattice mismatch and thermal mismatch between the epitaxially grown semiconductor layers (such as the first epitaxial layer 113) and the semiconductor substrate 10, and the buffer layer 112 may reduce dislocation density and defect density of the epitaxially grown semiconductor layer, to improve crystal quality.

The material of the first epitaxial layer 113 may be a group III nitride-based material such as at least one of GaN, AlN, InN, AlGaN, InGaN, AlInN or AlInGaN.

The process of forming the nucleation layer 111, and/or the buffer layer 112, and/or the first epitaxial layer 113 may include: Atomic Layer Deposition (ALD), or Chemical Vapor Deposition (CVD), or Molecular Beam Epitaxial growth method (MBE), or Plasma Enhanced Chemical Vapor Deposition (PECVD), or Low Pressure Chemical Vapor Deposition (LPCVD), or Metal-Organic Chemical Vapor Deposition (MOCVD), or a combination thereof.

Diffusion at the interface between the semiconductor substrate 10 and the Group III nitride-based material forms a substrate conductive layer 20. For example, silicon atoms in the silicon substrate 10 diffuse toward the Group III nitride-based material, and Group III atoms in the Group III nitride-based material diffuse toward the silicon substrate 10, resulting in the interface between the silicon substrate 10 and the Group III nitride-based material forming the substrate conductive layer 20.

In step S12, parts of the nucleation layer 111, parts of the buffer layer 112 and parts of the first epitaxial layer 113 can be removed by dry etching or wet etching.

The dry etching may be an inductively coupled plasma etching (ICP). The etching gas may include: $Cl_2$ and $BCl_3$.

The etching solution of the wet etching can be $H_3PO_4$ solution or KOH solution, which is corrosive on the N-face. GaN crystal is zincite structure in which the Ga, N atomic layers are in an ABABAB hexagonal layer stack with each Ga (N) atom bonded to the surrounding four N (Ga) atoms in a diamond-like tetrahedral structure. With reference to the Ga—N bonds parallel to the C-axis ([0001] crystal orientation), the upper surface is the Ga face if the Ga atom in each Ga—N bond is farther from the lower surface; the upper surface is the N face if the N atom in each Ga—N bond is farther from the lower surface. In this embodiment, the upper surfaces of the nucleation layer 111, the buffer layer 112 and the first epitaxial layer 113 can be controlled to be N-face.

In step S13, the material of the semiconductor substrate 10 may include silicon, the material of the isolation structure 12 may include silicon dioxide, and the isolation structure 12 is formed by local thermal oxidation (LOCOS). In other embodiments, the material of the isolation structure 12 may include at least one of silicon oxide, silicon nitride, aluminum oxide, hafnium oxide, magnesium oxide, titanium oxide, or gallium oxide, and the isolation structure 12 is formed by dry etching or wet etching.

Next, referring to step S2 in FIG. 1 and as shown in FIG. 4, a heterojunction structure 13 is epitaxially grown on the stacked structure 11, heterojunction structures on neighboring stacked structures are coalesced and distributed over an entire surface, and an air gap 14 is formed between the heterojunction structure 13 and each isolation structure 12.

In this embodiment, the heterojunction structure 13 can include, from bottom to top, a channel layer 131 and a barrier layer 132. Two-dimensional electron gas or two-dimensional hole gas can be formed at the interface between the channel layer 131 and the barrier layer 132. Alternatively, the channel layer 131 is an intrinsic GaN layer and the barrier layer 132 is an N-type AlGaN layer. Alternatively, the material of the channel layer 131 and the barrier layer 132 can include at least one of GaN, AlN, InN, AlGaN, InGaN, AlInN or AlInGaN. In addition, in addition to that the channel layer 131 and the barrier layer 132 each is single-layer as shown in FIG. 4, the channel layer 131 and the barrier layer 132 can each be multi-layer and be alternately distributed; or one channel layer 131 and two or more barrier layers 132 form multiple barrier structures.

The formation process of the heterojunction structure 13 may refer to the formation process of the nucleation layer 111, and/or the buffer layer 112, and/or the first epitaxial layer 113.

In this embodiment, the channel layer 131 is obtained by performing an epitaxial growth process for the first epitaxial layer 113. Thus, to reduce the dislocation density and defect density of the channel layer 131, the channel layer 131 is made of the same material as the first epitaxial layer 113.

In some embodiments, the channel layer 131 may be different from the material of the first epitaxial layer 113 based on requirements during the epitaxial growth process.

FIG. 4 is a schematic view of a cross-sectional structure of a semiconductor structure according to a first embodiment of the present disclosure.

Referring to FIG. 4, the semiconductor structure 1 of the embodiment includes:

a semiconductor substrate 10;

a plurality of stacked structures 11 and a plurality of isolation structures 12 on the semiconductor substrate 10, where the stacked structures 11 are spaced apart, and each of the isolation structures 12 is located between adjacent stacked structures 11; and each of the stacked structures 11 includes a nucleation layer 111 and a first epitaxial layer 113 from bottom to top; and a heterojunction structure 13 distributed on the stacked structures 11, the heterojunction structure 13 is distributed over an entire surface, and air gaps 14 are formed between the heterojunction structure 13 and each of the isolation structures 12.

The material of the semiconductor substrate 10 can include sapphire, silicon carbide, silicon or diamond.

The material of the nucleation layer 111 is a Group III nitride-based material, such as AlGaN, or the like. The material of the buffer layer 112 is also a Group III nitride-based material, such as at least one of GaN, AlN, InN, AlGaN, InGaN, AlInN, or AlInGaN. The nucleation layer 111 can relieve issues of lattice mismatch and thermal mismatch between the epitaxially grown semiconductor layer (such as the first epitaxial layer 113) and the semiconductor substrate 10, and the buffer layer 112 may reduce dislocation density and defect density of the epitaxially grown semiconductor layer, to improve crystal quality.

The material of the first epitaxial layer 113 may be a group III nitride-based material such as at least one of GaN, AlN, InN, AlGaN, InGaN, AlInN or AlInGaN.

The material of the isolation structure 12 can also be at least one of silicon oxide, silicon nitride, aluminum oxide, hafnium oxide, magnesium oxide, titanium oxide, or gallium oxide.

In this embodiment, the heterojunction structure 13 may include, from bottom to top, a channel layer 131 and a barrier layer 132. Two-dimensional electron gas or two-dimensional hole gas can be formed at the interface between the channel layer 131 and the barrier layer 132. Alternatively, the channel layer 131 is an intrinsic GaN layer and the barrier layer 132 is an N-type AlGaN layer. Alternatively, the material of the channel layer 131 and the barrier layer 132 can include at least one of GaN, AlN, InN, AlGaN, InGaN, AlInN and AlInGaN. In addition, in addition to that the channel layer 131 and the barrier layer 132 each is single-layer as shown in FIG. 4, the channel layer 131 and the barrier layer 132 can each be multi-layer and be alternately distributed; or one channel layer 131 and two or more barrier layers 132 form multiple barrier structures.

Diffusion at the interface between the semiconductor substrate 10 and the group III nitride-based material forms the substrate conductive layer 20. When the channel of the semiconductor structure 1 is conductive, the resistance of the substrate conductive layer 20 is very low, which will cause the Group III nitride-based material to leak electricity to the semiconductor substrate 10. In the semiconductor structure 1 in this embodiment, by using the isolation structures 12 to separate the stacked structures, on the one hand, the stacked structures can be made thicker to increase the distance between the interface of the heterojunction structure 13 and the substrate conductive layer 20, which is beneficial to reduce the leakage from the interface of the heterojunction structure 13 to semiconductor substrate 10, thereby reducing RF loss; and on the other hand, when the stacked structures are thickened, relative to a seamless stacked structure with the a thermal expansion coefficient different from the semiconductor substrate, if the stacked structure 11 is thicker, the stress accumulation is more likely to lead to the cracking problem of the seamless stacked structure. The separated stacked structures don't have cracking problem due to the weakened stress accumulation.

In addition, the isolation structures 12 and the air gaps (AR) 14 can also reduce the leakage from the interface of the heterojunction structure 13 to the semiconductor substrate 10.

Figure 5:
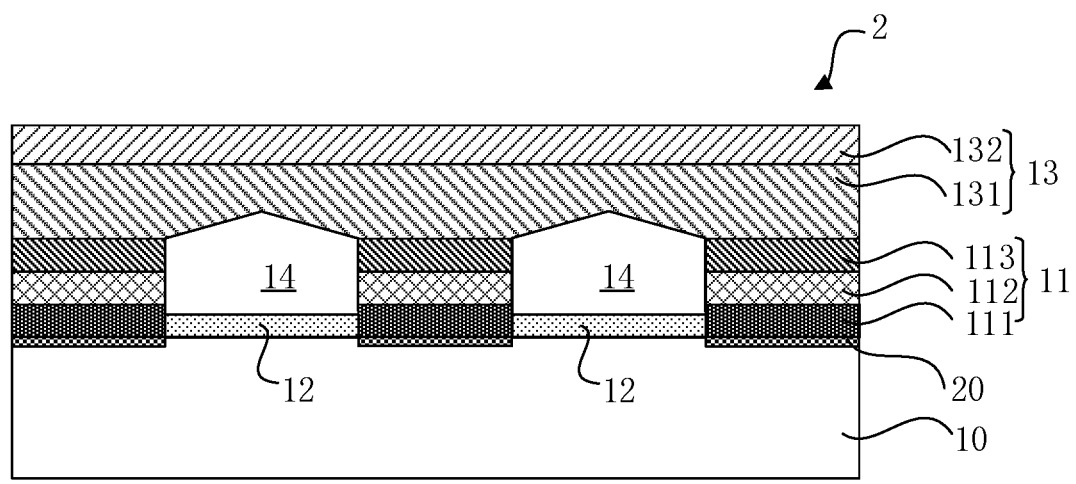
FIG. 5 is a schematic view of a cross-sectional structure of a semiconductor structure according to a second embodiment of the present disclosure.
Figure 6:
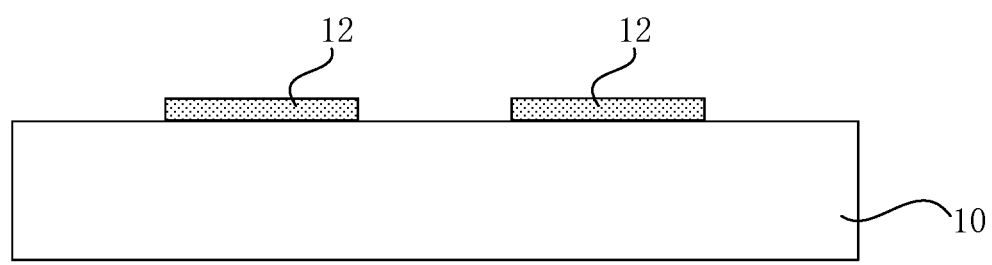
FIG. 6 and FIG. 7 are schematic views illustrating intermediate structures corresponding to the process to manufacturing semiconductor structure of FIG. 5.
Figure 7:
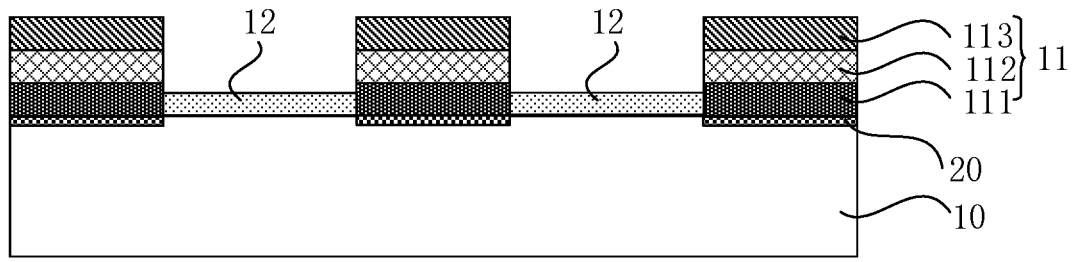

FIG. 5 is a schematic view of a cross-sectional structure of a semiconductor structure according to a second embodiment of the present disclosure. FIG. 6 and FIG. 7 are schematic views illustrating intermediate structures corresponding to the process to manufacturing the semiconductor structure of FIG. 5.

Referring to FIG. 5, the semiconductor structure 2 of the second embodiment is substantially the same as the semiconductor structure 1 of the first embodiment except that the substrate conductive layer 20 is only located between the each stacked structure 11 and the semiconductor substrate 10.

Accordingly, the manufacturing method of the semiconductor structure according to the second embodiment is substantially the same as the manufacturing method of the semiconductor structure according to the first embodiment, except that in step S1, respectively forming the stacked structures 11 and the isolation structures 12 on the semiconductor substrate 10 includes:

Step S11': referring to FIG. 6, isolation structures 12 spaced apart are formed on semiconductor substrate 10.

Step S12': referring to FIG. 7, a nucleation layer 111, a buffer layer 112, and a first epitaxial layer 113 are sequentially grown on the semiconductor substrate 10 by using the isolation structures 12 as masks to form the stacked structures 11.

In step S11', the material of the isolation structures 12 can include at least one of silicon oxide, silicon nitride, aluminum oxide, hafnium oxide, magnesium oxide, titanium oxide, or gallium oxide, and a method of forming the isolation structures 12 can include:

forming an insulating material layer by physical vapor deposition or chemical vapor deposition; and patterning the insulating material layer to form the isolation structures 12.

Where the insulating material layer is patterned by dry etching or wet etching.

Another method of forming the isolation structures 12 can include:

forming multiple trenches in the semiconductor substrate 10, and an insulating material layer is filled in the trench to form the isolation structures 12.

Forming the trenches in the semiconductor substrate 10 can be implemented by dry etching or wet etching. The filling of the insulating material layer in the trenches may be performed by depositing the insulating material layer on the whole surface, and then the insulating material layer outside the trenches are removed by chemical mechanical polishing.

The present disclosure has the following beneficial effects:

1) By using the isolation structures to separate the stacked structures, on the one hand, the stacked structures can be made thicker to increase the distance between the interface of the heterojunction structure and the substrate conductive layer, reduce the parasitic capacitance, thereby reducing the radio frequency loss, and reduce the leakage caused by the substrate conductive layer; on the other hand, when the stacked structures are thickened, relative to a seamless stacked structure with the a thermal expansion coefficient different from the semiconductor substrate, if the stacked structure is thicker, the stress accumulation is more likely to lead to the cracking problem of the seamless stacked structure. The separated stacked structures don't have cracking problem due to the weakened stress accumulation. In addition, the isolation structures and the air gaps (AR) can also reduce the leakage from the interface of the heterojunction structure to the semiconductor substrate.

2) In some embodiments, stacked structures and isolation structures are respectively formed on the semiconductor substrate by: a) forming isolation structures spaced apart on the semiconductor substrate; with the isolation structures as the masks, growing the nucleation layer and the first epitaxial layer on the semiconductor substrate in sequence to form the stacked structures; or b) growing the nucleation layer and the first epitaxial layer on the semiconductor substrate in sequence, removing parts of the nucleation layer and parts of the first epitaxial layer to expose the semiconductor substrate, where the rests of nucleation layer and the first epitaxial layer space apart to form stacked structures, forming isolation structures on the exposed the semiconductor substrate. Compared with solution b), the advantage of solution a) includes that the substrate conductive layer formed between the stack structure and the semiconductor substrate is also separated, which is beneficial to further reduce substrate electric leakage.

Figure 8:
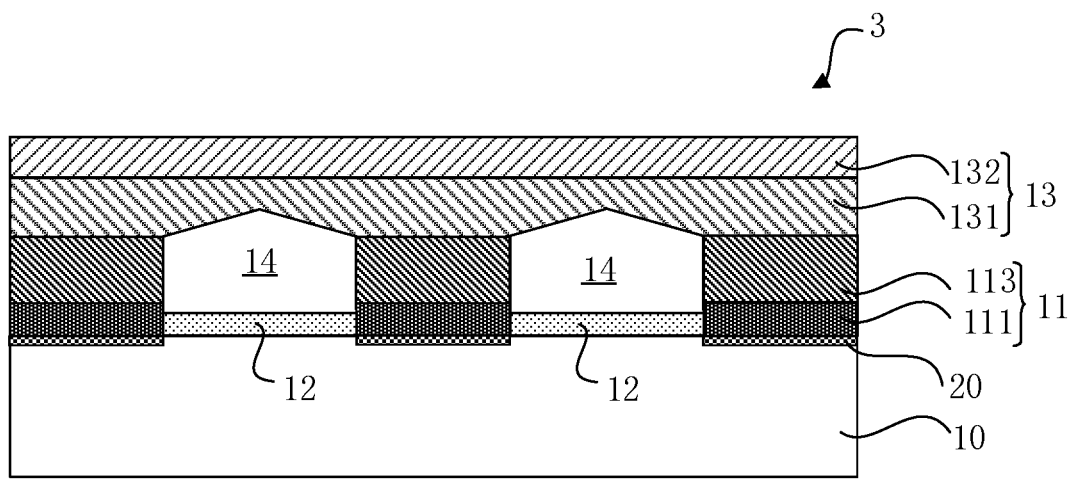
FIG. 8 is a schematic view of a cross-sectional structure of a semiconductor structure according to a third embodiment of the present disclosure.

FIG. 8 is a schematic view of a cross-sectional structure of a semiconductor structure according to a third embodiment of the present disclosure.

Referring to FIG. 8, the semiconductor structure 3 of the third embodiment and the manufacturing method thereof are substantially the same as the semiconductor structures 1 and 2 of the first and the second embodiments and the manufacturing method thereof, except that the buffer layer 112 is omitted in the stacked structure 11.

Figure 9:
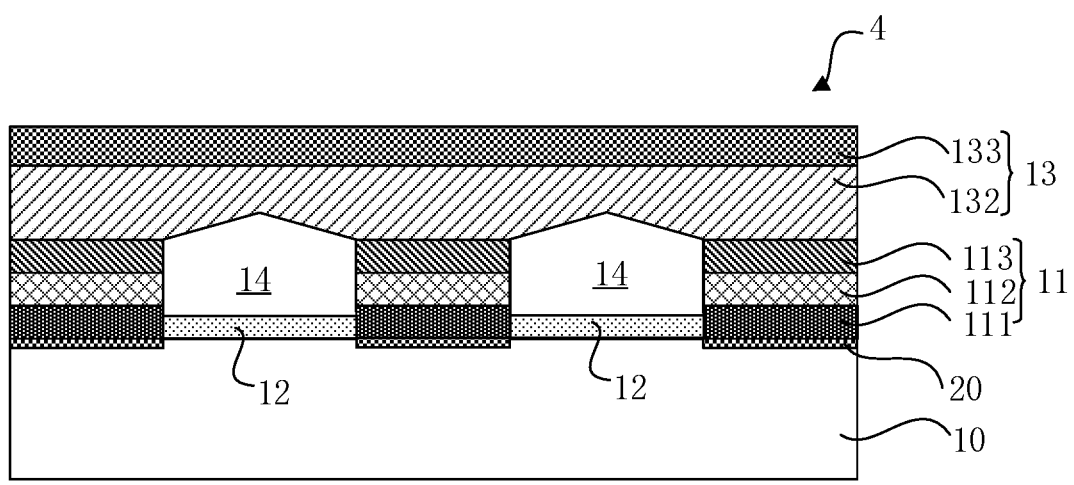
FIG. 9 is a schematic view of a cross-sectional structure of a semiconductor structure according to a fourth embodiment of the present disclosure.

FIG. 9 is a schematic view of a cross-sectional structure of a semiconductor structure according to a fourth embodiment of the present disclosure;

Referring to FIG. 9, the semiconductor structure 4 of the fourth embodiment and the manufacturing method thereof are substantially the same as the semiconductor structures 1, 2, 3 of the first, second and third embodiments and the manufacturing method thereof, except that the heterojunction structure 13 includes, from bottom to top, a back-barrier layer 133 and a channel layer 131.

Two-dimensional electron gas or two-dimensional hole gas can be formed at the interface between the back-barrier layer 133 and the channel layer 131.

In some examples, the back-barrier layer 133 is the same material as the first epitaxial layer 113.

Figure 10:
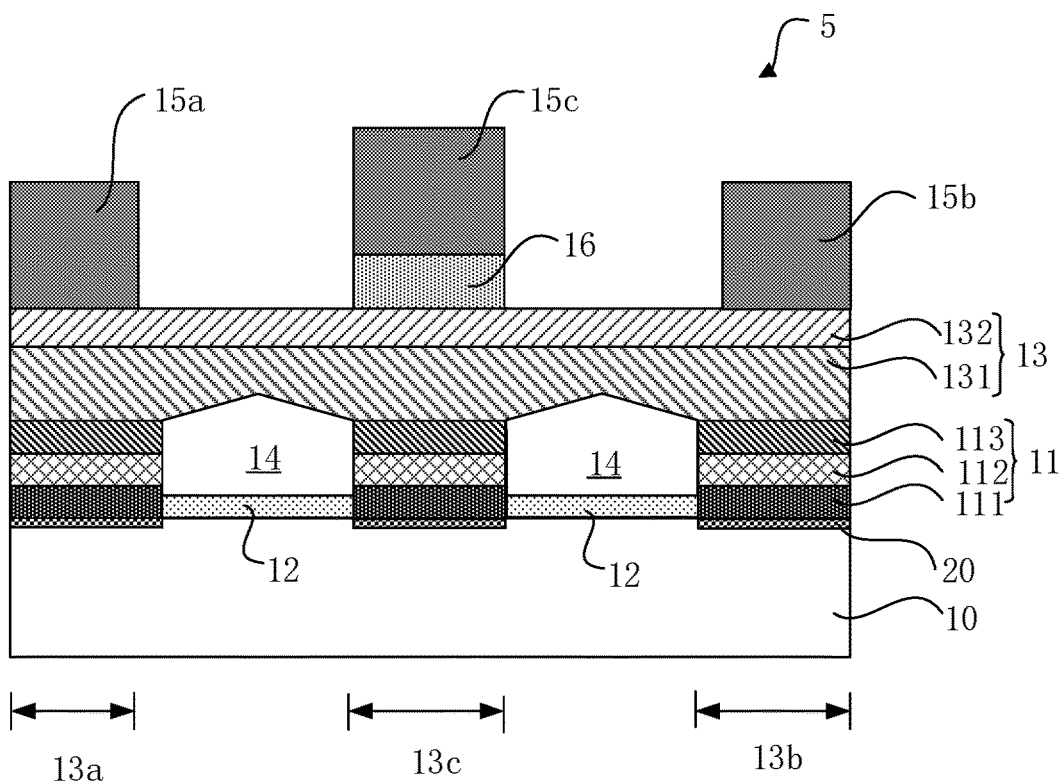
FIG. 10 is a schematic view of a cross-sectional structure of a semiconductor structure according to a fifth embodiment of the present disclosure.

FIG. 10 is a schematic view of a cross-sectional structure of a semiconductor structure according to a fifth embodiment of the present disclosure.

Referring to FIG. 10, the semiconductor structure 5 in the fifth embodiment is substantially the same as the semiconductor structures 1, 2, 3, 4 in the first, second, third, and fourth embodiments, except that the heterojunction structure 13 includes: a source region 13a and a drain region 13b, and a gate region 13c between the source region 13a and the drain region 13b; a source electrode 15a is on the source region 13a, a drain electrode 15b is on the drain region 13b, and a P-type semiconductor layer 16 is in the gate region 13c and a gate electrode 15c is on the P-type semiconductor layer 16.

In this embodiment, the P-type semiconductor layer 16 is capable of depleting the two-dimensional electron gas in the heterojunction structure 13 to cut off the conduction of the channel. That is, a normally off state is formed by the P-type semiconductor layer 16, in other words, the enhanced semiconductor structure 5 is formed.

The material of the P-type semiconductor layer 16 may be a Group III nitride-based material, and the corresponding formation method may refer to the formation process of the channel layer 131 or the barrier layer 132. The P-type dopant ions may be at least one kind of Mg ions, Zn ions, Ca ions, Sr ions, or Ba ions.

In FIG. 10, the source electrode 15a and the drain electrode 15b contact the barrier layer 132, and ohmic contacts are formed between the source electrode 15a and the barrier layer 132 and between the drain electrode 15b and the barrier layer 132. The source electrode 15a, the drain electrode 15b, and the gate electrode 15c may be made of metal, such as conductive materials Ti/Al/Ni Au, Ni Au, etc.

In some embodiments, ohmic contacts may be formed between the source electrode 15a and the barrier layer 132 and between the drain electrode 15b and the barrier layer 132 by using a heavily N-doped layer. The heavily N-doped layer enables ohmic contacts be formed directly between the source electrode 15a and the source region 13a of the heterojunction structure 13, and between the drain electrode 15b and the drain region 13b of the heterojunction structure 13 without high temperature annealing, and prevents the heterojunction structure 13 during the annealing process from degradation of the performance and the reduction of electron migration rate caused by high temperature.

In some embodiments, a heavily N-doped layer is formed on at least one of the source region 13a or the drain region 13b of the heterojunction structure 13. The source region 13a of the heterojunction structure 13 without the heavily N-doped layer and the source electrode 15a, or the drain region 13b of the heterojunction structure 13 without the heavily N-doped layer and the drain 15b form an ohmic contact layer by high-temperature annealing.

The N-type ions in the heavily N-doped layer may include at least one of Si ions, Ge ions, Sn ions, Se ions or Te ions. The doping concentration may be greater than 1E19/cm3 for different N-type ions. The heavily N-doped layer can be a Group III nitride-based material, such as at least one of GaN, AlN, InN, AlGaN, InGaN, AlInN or AlInGaN.

Accordingly, the manufacturing method further includes step S3, a source 15a is formed on the source region 13a, a drain 15b is formed on the drain region 13b, and a P-type semiconductor layer 16 and a gate 15c are formed in sequence in the gate region 13c.

The region covered by the P-type semiconductor layer 16 can be slightly larger than the gate region 13c. Specifically, in step S3, the P-type semiconductor layer 16 can be formed first, followed by forming the source electrode 15a, the drain electrode 15b, and the gate electrode 15c in the same process.

The P-type doped ions in the P-type semiconductor layer 16 can be doped in situ, that is, doped while growing.

Figure 11:
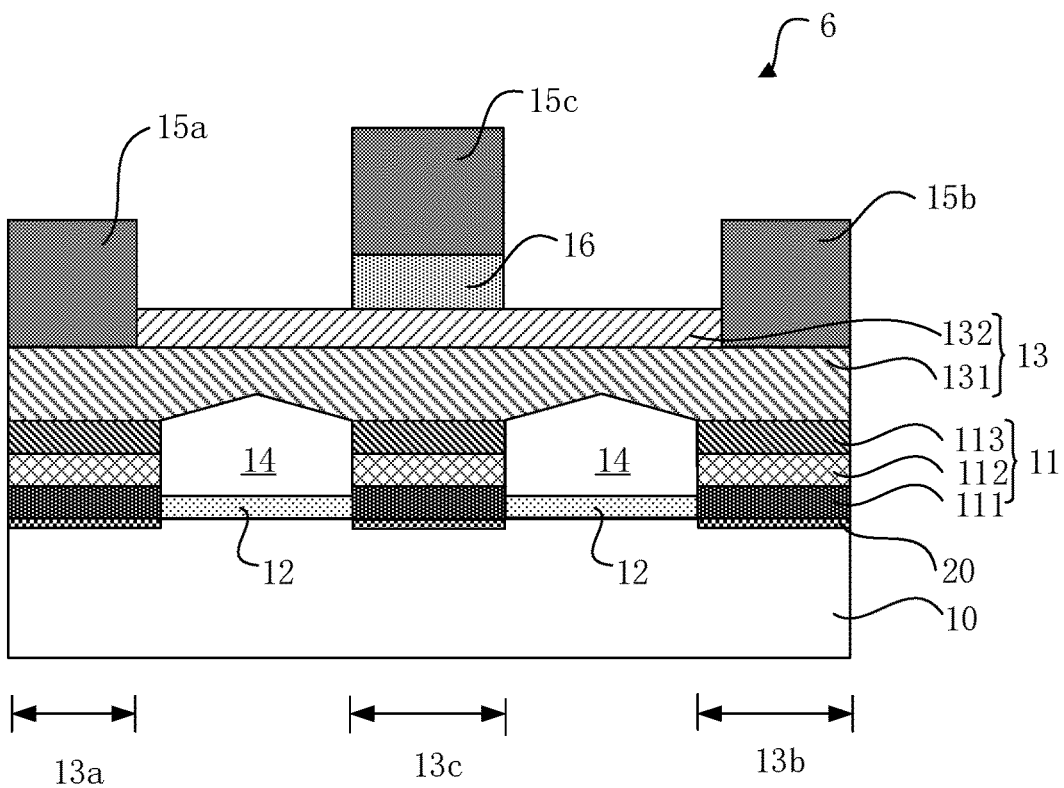
FIG. 11 is a schematic view of a cross-sectional structure of a semiconductor structure according to a sixth embodiment of the present disclosure.

FIG. 11 is a schematic view of a cross-sectional structure of a semiconductor structure according to a sixth embodiment of the present disclosure.

Referring to FIG. 11, the semiconductor structure 6 of the sixth embodiment is substantially the same as the semiconductor structure 5 of the fifth embodiment, except that, referring to FIG. 11, the source 15a and drain 15b contact the channel layer 132, and an ohmic contact is formed between them.

Accordingly, for the manufacturing method, in step S3, the barrier layer 132 of the source region 13a and the drain region 13b is also removed.

Although the present disclosure discloses the above contents, the present disclosure is not limited thereto. One of ordinary skill in the art can make various variants and modifications to the present disclosure without departing from the spirit and scope of the present disclosure. Therefore, the protection scope of the present disclosure should be set forth by the appended claims.

The invention claimed is:

1. A semiconductor structure, comprising:
a semiconductor substrate;
a plurality of stacked structures and a plurality of isolation structures on the semiconductor substrate, wherein the stacked structures are spaced apart each other, each of the isolation structures is located between adjacent stacked structures, each of the stacked structures comprises a nucleation layer and a first epitaxial layer from bottom to top; and
a heterojunction structure on the plurality of stacked structures, wherein the heterojunction structure is distributed over an entire surface, and an air gap is formed between the heterojunction structure and each of the isolation structures.

2. The semiconductor structure according to claim 1, wherein each of the stacked structures further comprises a buffer layer between the nucleation layer and the first epitaxial layer.

3. The semiconductor structure according to claim 1, wherein the heterojunction structure comprises a channel layer and a barrier layer from bottom to top, the first epitaxial layer and the channel layer are made of a same material; or
the heterojunction structure comprises a back-barrier layer and a channel layer from bottom to top, the first epitaxial layer and the back-barrier layer are made of a same material.

4. The semiconductor structure according to claim 1, wherein a material of the semiconductor substrate is sapphire, silicon carbide, silicon or diamond, and a material of the isolation structures is at least one of silicon oxide, silicon nitride, aluminum oxide, hafnium oxide, magnesium oxide, titanium oxide, or gallium oxide.

5. The semiconductor structure according to claim 1, wherein a material of the nucleation layer is AlN or AlGaN, and a material of the first epitaxial layer and the heterojunction structure is at least one of GaN, AlN, InN, AlGaN, InGaN, AlInN or AlInGaN.

6. The semiconductor structure according to claim 1, wherein the heterojunction structure comprises: a source region, a drain region, and a gate region between the source region and the drain region; wherein a source electrode is on the source region, a drain electrode is on the drain region, and a P-type semiconductor layer is in the gate region and a gate electrode is on the P-type semiconductor layer.

7. A method of manufacturing the semiconductor structure according to claim 1, comprising:
providing the semiconductor substrate;
respectively forming the plurality of stacked structures and the plurality of isolation structures on the semiconductor substrate, wherein the stacked structures are spaced apart each other, and each of the isolation structures is located between adjacent stacked structures; each of the stacked structures comprises the nucleation layer and the first epitaxial layer from bottom to top; and
epitaxially growing the heterojunction structure on each of the plurality of stacked structures, wherein heterojunction structures on adjacent stacked structures are coalesced and distributed over the entire surface, and the air gap is formed between the heterojunction structure and each of the isolation structures.

8. The method of manufacturing semiconductor structure according to claim 7, wherein respectively forming the plurality of stacked structures and the plurality of isolation structures on the semiconductor substrate comprises:
forming the isolation structures spaced apart on the semiconductor substrate, and growing a nucleation layer and a first epitaxial layer in sequence on the semiconductor substrate by using the isolation structures as masks to form the plurality of stacked structures.

9. The method of manufacturing semiconductor structure according to claim 7, wherein respectively forming the plurality of stacked structures and the plurality of isolation structures on the semiconductor substrate comprises:
growing a nucleation layer and a first epitaxial layer in sequence on the semiconductor substrate;
removing parts of the nucleation layer and parts of the first epitaxial layer to expose the semiconductor substrate, such that rests of nucleation layer and rests of the first epitaxial layer space apart to form the plurality of stacked structures; and
forming isolation structures on the exposed semiconductor substrate.

10. The method of manufacturing semiconductor structure according to claim 8, wherein a buffer layer is further grown on the nucleation layer before the first epitaxial layer is grown.

11. The method of manufacturing semiconductor structure according to claim 8, wherein a material of the semiconductor substrate is sapphire, silicon carbide, silicon or diamond, and a material of the isolation structures is at least one of silicon oxide, silicon nitride, aluminum oxide, hafnium oxide, magnesium oxide, titanium oxide, or gallium oxide, the plurality of isolation structures are formed by:
forming an insulating material layer by physical vapor deposition or chemical vapor deposition, and patterning the insulating material layer to form the plurality of isolation structures; or
the plurality of isolation structures are formed by:
forming a plurality of trenches in the semiconductor substrate, and filling an insulating material layer in the trenches to form the plurality of isolation structures.

12. The method of manufacturing semiconductor structure according to claim 9, wherein a material of the semiconductor substrate is silicon, a material of the isolation structures is silicon dioxide, and the isolation structures are formed by local thermal oxidation.

13. The method of manufacturing semiconductor structure according to claim 7, wherein the heterojunction structure comprises a channel layer and a barrier layer from bottom to top, the first epitaxial layer and the channel layer are made of a same material; or
the heterojunction structure comprises a back-barrier layer and a channel layer from bottom to top, the first epitaxial layer and the back-barrier layer are made of a same material.

14. The method of manufacturing semiconductor structure according to claim 7, wherein the heterojunction structure comprises: a source region, a drain region, and a gate region between the source region and the drain region; the method further comprising:
forming a source electrode on the source region,
forming a drain electrode on the drain region,
forming a P-type semiconductor layer in the gate region, and
forming a gate electrode on the P-type semiconductor layer.

* * * * *